United States Patent
Yamane

(10) Patent No.: US 9,306,119 B2
(45) Date of Patent: Apr. 5, 2016

(54) SEMICONDUCTOR LIGHT-EMITTING ELEMENT AND MANUFACTURING METHOD THEREOF

(71) Applicant: STANLEY ELECTRIC CO., LTD., Meguro-ku, Tokyo (JP)

(72) Inventor: Takayoshi Yamane, Yokohama (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 14/077,049

(22) Filed: Nov. 11, 2013

(65) Prior Publication Data

US 2014/0138726 A1 May 22, 2014

(30) Foreign Application Priority Data

Nov. 19, 2012 (JP) ................................ 2012-253412

(51) Int. Cl.
- *H01L 33/22* (2010.01)
- *H01L 33/32* (2010.01)
- *H01L 33/00* (2010.01)
- *H01L 33/02* (2010.01)

(52) U.S. Cl.
CPC ............ *H01L 33/22* (2013.01); *H01L 33/007* (2013.01); *H01L 33/02* (2013.01); *H01L 33/32* (2013.01)

(58) Field of Classification Search
CPC ...................................................... H01L 33/22
See application file for complete search history.

(56) References Cited

U.S. PATENT DOCUMENTS

| | | | | |
|---|---|---|---|---|
| 2010/0127239 A1* | 5/2010 | Park | ......................... | H01L 33/02 257/13 |
| 2011/0309400 A1* | 12/2011 | Fukushima et al. | ............ | 257/98 |
| 2013/0099141 A1* | 4/2013 | Chua | ....................... | H01L 33/06 250/504 R |
| 2014/0034958 A1* | 2/2014 | Lim | ....................... | H01L 33/145 257/76 |
| 2014/0339598 A1* | 11/2014 | Park | ....................... | H01L 33/325 257/101 |
| 2015/0108427 A1* | 4/2015 | Brueck | ............. | H01L 21/02381 257/14 |

FOREIGN PATENT DOCUMENTS

| | | |
|---|---|---|
| JP | 11-68155 A | 3/1999 |
| JP | 2005-167194 A | 6/2005 |
| JP | 2008-135768 A | 6/2008 |
| JP | 2011-205148 A | 10/2011 |
| JP | 2012-119700 A | 6/2012 |
| WO | WO 2013100619 A1 * | 7/2013 ............ H01L 33/325 |

OTHER PUBLICATIONS

Han, et al., "Applied Physics Letters 94, 231123 (2009): Effect of electron blocking layer on efficiency droop in InGaN/GaN multiple quantum well light-emitting diodes", Applied Physics Letters 94, 231123 (2009); American Institute of Physics.

* cited by examiner

*Primary Examiner* — Peniel M Gumedzoe
*Assistant Examiner* — Christopher Johnson
(74) *Attorney, Agent, or Firm* — Holtz, Holtz & Volek PC

(57) ABSTRACT

Provided is a semiconductor light-emitting element in which dopant interdiffusion is suppressed, the efficiency at which a carrier is infused into an active layer is improved, and there is less of a decrease in light-emitting intensity (droop) during high-current driving at a high light-emitting efficiency. The semiconductor light-emitting element composed of a GaN-based semiconductor includes an n-type semiconductor layer, an active layer formed on the n-type semiconductor layer, a first semiconductor layer formed on the active layer and having a concave/convex structure layer in the surface, and a second semiconductor structure layer doped with Mg and formed on the first semiconductor layer.

3 Claims, 5 Drawing Sheets

SEMICONDUCTOR LIGHT-EMITTING ELEMENT AND MANUFACTURING METHOD THEREOF

BACKGROUND OF THE INVENTION

1. Field of the Invention

The present invention relates to a semiconductor light-emitting element and a method for manufacturing the same, and particularly relates to a gallium nitride (GaN) based semiconductor light-emitting element and a method for manufacturing the same.

2. Description of the Related Art

There have been various contrivances for semiconductor layer structures and crystal growth methods in order to increase light-emitting efficiency and performance in semiconductor light-emitting elements such as light-emitting diodes (LEDs) and semiconductor lasers. There have been disclosed, for example, light-emitting elements comprising nitride semiconductor layers in which the p-type impurity concentration gradually decreases (e.g. Patent Reference 1), carrier-overflow prevention layers and impurity diffusion prevention layers (e.g. Patent Reference 2), decreasing crystal defects and suppressing diffusion of impurities into active layers (e.g. Patent Reference 3), improving light extraction efficiency (e.g. Patent Reference 4), and methods for growing semiconductor layers of group III-V nitride compounds having satisfactory crystal quality (e.g. Patent Reference 5).

It is particularly important to improve the efficiency of infusing a carrier into an active layer to increase the light-emitting efficiency of a light-emitting element. For example, the light-emitting intensity of an LED is proportional to the electric current, but when the LED is driven at a high electric current density, the proportional relationship is undone and its light-emitting intensity declines (i.e. a droop phenomenon). For example, Non-patent Reference 1 discloses a study of the droop suppression effect of a p-AlGaN electron blocking layer (EBL) in a GaN-based LED; in particular, a study of forming an area where positive holes collect in the interface between the EBL layer and the p-GaN layer (two-dimensional hole gas-like layer), and suppressing the injection of holes into the active layer at the time of high electric current density.

[Patent Reference 1] JP-A 11-68155
[Patent Reference 2] JP-A 2011-205148
[Patent Reference 3] JP-A 2005-167194
[Patent Reference 4] JP-A 2012-119700
[Patent Reference 5] JP-A 2008-135768
[Non-patent Reference 1] Applied Physics Letters 94, 231123 (2009)

SUMMARY OF THE INVENTION

The present invention was contrived in view of the above circumstances, it being an object thereof to provide a high-performance semiconductor light-emitting element and a method for manufacturing the same, in which dopant interdiffusion is suppressed, the efficiency at which carriers (holes) are infused into an active layer is improved, and the deterioration of light-emitting intensity (droop) is decreased even during high-electric-current driving at a high light-emitting efficiency.

The light-emitting element of the present invention is a light-emitting element composed of a GaN-based semiconductor, the light-emitting element comprising:
an n-type semiconductor layer;
an active layer formed on the n-type semiconductor layer;
a first semiconductor layer formed on the active layer and having a concave/convex structure layer in the surface; and
a second semiconductor layer doped with Mg and formed on the first semiconductor layer.

The method of the present invention is a method for manufacturing a light-emitting element composed of a GaN-based semiconductor, comprising the steps of:
growing an n-type semiconductor layer;
growing an active layer on the n-type semiconductor layer;
growing a first semiconductor layer on the active layer, the first semiconductor layer having a concave/convex structure layer 1 to 5 nm deep in the surface; and
growing a second semiconductor layer doped with Mg on the first semiconductor layer.

BRIEF DESCRIPTION OF THE DRAWINGS

The aforementioned aspects and other features of the present invention are explained in the following description, taken in connection with the accompanying drawing figures wherein.

DETAILED DESCRIPTION OF THE INVENTION

The light-emitting element composed of a GaN-based semiconductor of the present invention is described below. This light-emitting element has a first p-type semiconductor layer doped with Mg and formed on an active layer, and a second p-type semiconductor layer doped with Mg and formed on the first p-type semiconductor layer. The first p-type semiconductor layer has a concave/convex structure layer in the side interfacing with the second p-type semiconductor layer. The concave/convex structure layer functions as a diffusion prevention layer for suppressing interdiffusion of the dopants (Mg) of the p-type semiconductor layers. Preferred embodiments of the present invention are described below, and these may be altered and combined as appropriate. In the following description and accompanying drawings, components that are substantially identical or equivalent are denoted by the same reference symbols.

[Embodiment 1]

Figure 1:
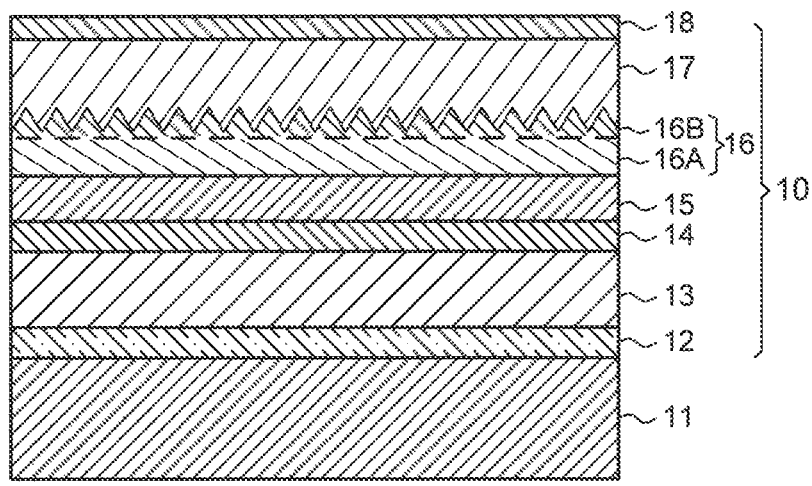
FIG. 1 is a cross-sectional view schematically showing the configuration of the semiconductor structure layer of a light-emitting diode (LED), which is Embodiment 1.

FIG. 1 is a cross-sectional view schematically showing the configuration of the semiconductor structure layer 10 of a light-emitting diode (LED), which is Embodiment 1. As shown in FIG. 1, a GaN buffer layer 12, an n-GaN layer 13, a super lattice structure layer (SLS) 14, a multiple quantum well (MQW) active layer 15, an AlGaN electron blocking layer (EBL) 16 containing a diffusion prevention layer 16B, a p-GaN layer 17, and a GaN contact layer 18 are formed sequentially in the order listed on a substrate 11.

[Formation of Semiconductor Structure Layer]

The step of creating the semiconductor structure layer 10 is described in detail below. A sapphire single-crystal substrate in which the growth plane is the c-plane was used as the substrate for growing the semiconductor structure layer 10. The semiconductor structure layer 10 was grown on the growth substrate 11 by MOCVD.

Trimethyl gallium (TMG), trimethyl aluminum (TMA), and trimethyl indium (TMI) were used as group-III organic metal raw materials. Ammonia ($NH_3$) was used as a V-group hydride raw material Disilane ($Si_2H_6$) was used as an n-type dopant, and bis-cyclopentadienyl magnesium ($CP_2Mg$) was used as a p-type dopant. Hydrogen ($H_2$) and nitrogen ($N_2$) were used as carrier gases, and crystal growth was conducted in an atmosphere of normal pressure.

First, the sapphire substrate was annealed for ten minutes at 1000° C. in a mixed carrier gas of $H_2$ and $N_2$. The substrate temperature was then brought to 500° C., after which TMG and $NH_3$ were used to grow the low-temperature growing GaN buffer layer (referred to below simply as the buffer layer) 12 in a thickness of 30 nm (nanometers) on the sapphire substrate 11. Next, hydrogen ($H_2$) was used as a carrier gas, the substrate temperature was increased to 1000° C. in an atmosphere of $NH_3$, the GaN buffer layer 12 was annealed for seven minutes, the TMG and $Si_2H_6$ were subsequently supplied, and the n-GaN layer 13 doped with Si was grown to a thickness of 5 μm on the GaN buffer layer 12.

Next, the substrate temperature was lowered to 750° C. and kept constant in a mixed atmosphere of $NH_3$, $N_2$, and $H_2$, after which the supply of $H_2$ was stopped, TMG, TMI, and $NH_3$ were supplied, and the super lattice structure layer (SLS) 14 was grown. After the super lattice structure layer 14 was grown, the steps of supplying TMI and TMG while continuing to supply $NH_3$ to form an InGaN well layer, and then stopping the supply of TMI to form a GaN barrier layer were repeated, and an MQW active layer (light-emitting layer) 15 of an undoped InGaN-based semiconductor was grown. More specifically, the composition and thickness of the well layer were established so that the emitted light wavelength (the band gap of the MQW) was 450 nm. The barrier layer may be another GaN-based semiconductor layer, e.g., an InGaN layer. The super lattice structure layer 14 does not necessarily need to be provided, and the active layer 15 may be provided on the n-GaN layer 13. The active layer 15 is also not limited to an MQW active layer; it may be a single quantum well (SQW) or a single layer ("bulk").

Next, the substrate temperature was raised to 1000° C. and kept constant in a mixed atmosphere of $NH_3$, $N_2$, and $H_2$, after which a carrier gas mixed so as to have a value F (the ratio of hydrogen in the carrier gas), described in detail hereinafter, of 0.23 was used to supply TMG, TMA, $CP_2Mg$, and an amount of $NH_3$ with a V/III ratio of 50000, and an $Al_xGa_{1-x}N$ layer 16 doped with Mg was grown as a first semiconductor layer formed on the active layer 15. The thickness of the $Al_xGa_{1-x}N$ layer 16 was 24 nm, and the Al composition (x) was 21% (x=0.21). The $Al_xGa_{1-x}N$ layer 16 (0<x) has a larger band gap than the barrier layer of the MQW active layer 15, and functions as an electron blocking layer. The first semiconductor layer 16 is not limited to a p-type semiconductor layer and may be an undoped layer.

As will be described in detail hereinafter, when the $Al_xGa_{1-x}N$ layer 16 was grown, a $Al_xGa_{1-x}N$ electron blocking layer (also referred to as the AlGaN-EBL layer below) 16 having a concave/convex structure layer in the surface was formed by growth with a low growth temperature for the resulting Al composition in terms of the $Al_xGa_{1-x}N$, an extremely high V/III ratio, and a supplied amount of $H_2$ that moderately decomposed the GaN component. The surface layer composed of the concave/convex structure thus formed functions as a layer for preventing Mg diffusion, i.e. a diffusion prevention layer 16B. In the drawing, the portion of the AlGaN electron blocking layer (the AlGaN-EBL layer) 16 other than the diffusion prevention layer 16B is noted as an AlGaN layer 16A.

The diffusion prevention layer 16B is not limited to the method described above; it is also possible, after forming a flat AlGaN layer, to intentionally form a concave/convex structure in the surface by adjusting the growth conditions and form a diffusion prevention layer in the same manner as described above. Another option is to omit the AlGaN layer 16A and use the entire $Al_xGa_{1-x}N$ electron blocking layer 16 as the diffusion prevention layer (the concave/convex structure layer).

Furthermore, another semiconductor layer (a third semiconductor layer) may be provided between the electron blocking layer (AlGaN-EBL layer) 16 and the active layer 15.

After the AlGaN-EBL layer 16 having the diffusion prevention layer 16B on the surface was grown, the supply of TMG and TMA was stopped, and the temperature was raised to 1100° C. At this time, the ratio of $H_2$ in the carrier gas was regulated so that F=0.17 under a stream of $NH_3$. The form of the concave/convex structure of the diffusion prevention layer 16B (e.g., characteristics such as the depth and density) can thereby be regulated so as to yield a structure whereby Mg diffusion is more effectively blocked.

After the substrate temperature was fixed at 1100° C., TMG and $CP_2Mg$ were supplied and a p-GaN layer 17 was grown in a thickness of 97 nm as a second semiconductor layer (p-type) on the AlGaN-EBL layer 16 (the first semiconductor layer). The amount of $CP_2Mg$ supplied was then increased, and a GaN contact layer 18 functioning as a p-contact layer was grown in a thickness of 3 nm.

After the semiconductor structure layer 10 was grown, LED elements were created by providing electrodes connected to the p-contact layer 18 and the n-GaN layer 13, and the characteristics thereof were evaluated.

[Results of Analyzing Semiconductor Structure Layer]

An evaluation was conducted on a sample of the semiconductor structure layer 10 formed by the embodiment described above. For a comparison with the present embodiment, a semiconductor structure layer having no diffusion prevention layer was grown and evaluated as a comparative example.

Figure 2:
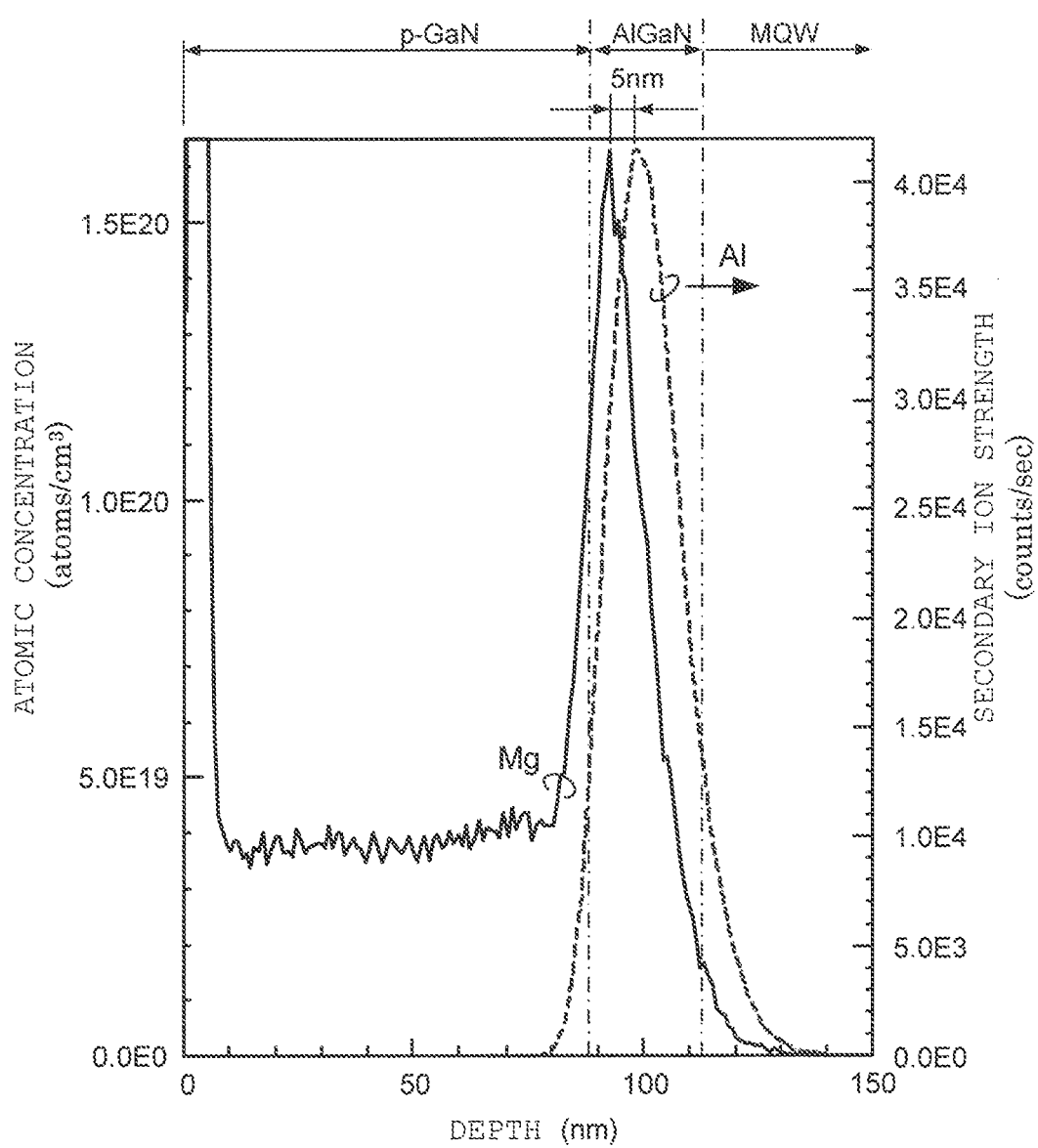
FIG. 2 is a graph showing a profile in the direction of SIMS depth in an embodiment.
Figure 3:
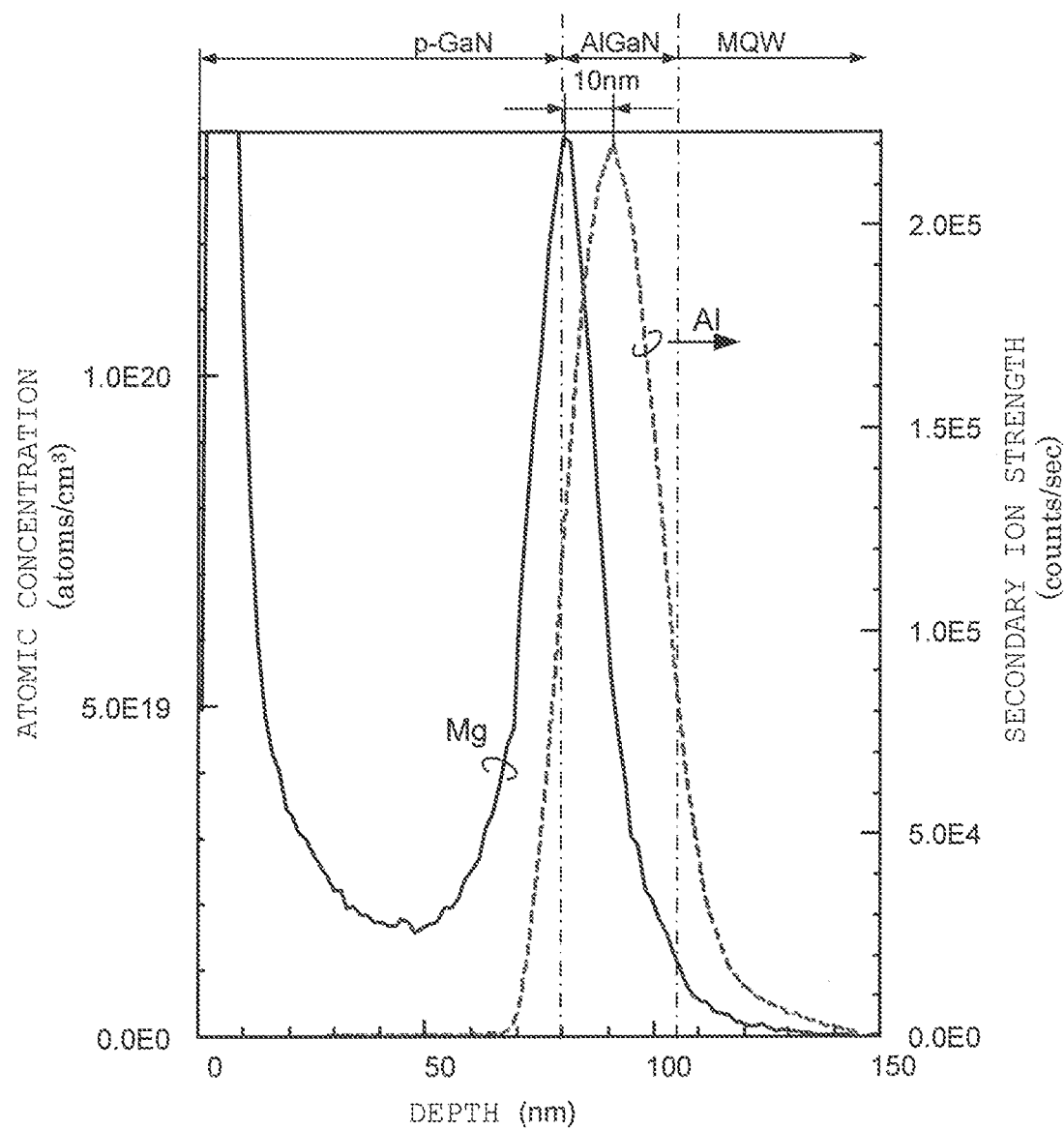
FIG. 3 is graph showing a profile in the direction of SIMS depth in a comparative example.

FIGS. 2 and 3 show a depthwise profile of secondary ion mass spectrometry (SIMS) of the present embodiment and the comparative example, respectively. The solid line profiles each represent an Mg concentration (atoms/$cm^3$) (the left vertical axis), and the dashed line profiles each represent secondary ion strength (counts/sec) of Al (the right vertical axis). The vertical axis scale represents a standardization of peak strength so that the peak positions of Mg and Al can be easily compared. The vertical divisions of scales in FIGS. 2 and 3 are exponent notations; e.g., 5E19 represents $5 \times 10^{19}$.

First, the peak positions of the Al secondary ion strength and the Mg concentration are compared. As shown in FIG. 3, it can be seen that the sample of the comparative example having no diffusion prevention layer exhibits a large peak-to-peak distance (approximately 10 nm), whereas the sample having a diffusion prevention layer 16B exhibits a small peak-to-peak distance (approximately 5 nm). The increasing of the Al secondary ion strength represents the position of the AlGaN layer, and the deviation of the Mg peak position from the Al peak position therefore shows that the Mg atoms in the AlGaN crystals moves by diffusion. The direction of this movement is the direction of the p-GaN layer, this phenomenon promotes the creation of two-dimensional hole gas-like layer in near the interface between the AlGaN layer and the p-GaN layer, the efficiency of carrier injection is decreased, and the light-emitting characteristic of the LEDs is deteriorated. On the other hand, in the case of the present embodiment as shown in FIG. 2, the peak-to-peak distance is shortened by introducing a diffusion prevention layer, and Mg diffusion can be suppressed. In view of the positions of each of the layers shown in the top of those figures, it is understood that the Mg atoms are confined to the AlGaN layer (AlGaN-EBL layer) 16 in the present embodiment in which the diffusion prevention layer is introduced, whereas the Mg atoms diffuse into the p-GaN layer 17 in the comparative example having no diffusion prevention layer.

Next, attention is given to the section of the Mg concentration profile that transitions from the AlGaN layer to the p-GaN layer, and to the Mg concentration in the p-GaN layer. In the case of the comparative example having no diffusion prevention layer (FIG. 3), the change in Mg concentration from the AlGaN layer to the p-GaN layer is not steep, and the Mg concentration changes so as to resemble a trailing skirt. The Mg concentration is not uniform in the p-GaN layer, and the Mg concentration has a greatly concaved profile. Specifically, it is clear that the Mg concentration has a width of about $1.5 \times 10^{19}$ $cm^{-3}$ to $5 \times 10^{19}$ $cm^{-3}$. This suggests that the Mg diffuses dramatically in the AlGaN layer and the p-GaN layer. On the other hand, in the case of the present embodiment having the diffusion prevention layer 16B (FIG. 2), there is a steep change in the Mg concentration from the AlGaN layer (AlGaN-EBL layer) 16 to the p-GaN layer 17, the Mg concentration in the p-GaN layer 17 also has a substantially constant profile at approximately $4.0 \times 10^{19}$ $cm^{-3}$, and there is a distinct contrast with the case of the comparative example. This shows that the Mg does not move between the AlGaN layer 16 and the p-GaN layer 17, and it is clear that Mg interdiffusion is completely blocked by the diffusion prevention layer 16B.

Figure 4:
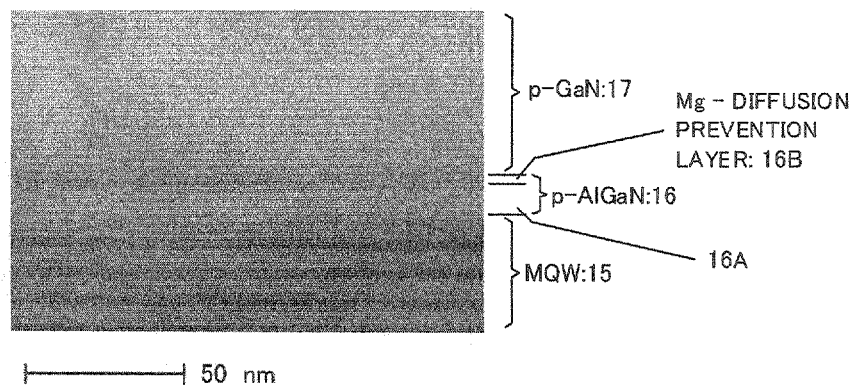
FIG. 4 is a TEM image of a semiconductor structure layer provided with a diffusion prevention layer in the embodiment.
Figure 5:
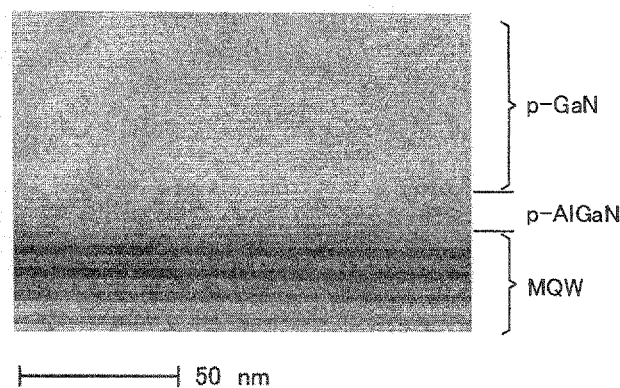
FIG. 5 is TEM image of a semiconductor structure layer having no diffusion prevention layer in the comparative example.

Furthermore, to confirm that Mg diffusion is suppressed in the semiconductor structure layer 10 of the present embodiment, observations are made with a transmission electron microscope (TEM). FIG. 4 is a TEM image showing the MQW active layer (a part thereof), the AlGaN layer 16A and diffusion prevention layer 16B, the p-GaN layer 17 (a part thereof) and the vicinity thereof in the semiconductor structure layer 10 provided with a diffusion prevention layer of the present embodiment. FIG. 5 is a similar TEM image showing the comparative example having no diffusion prevention layer; i.e., a TEM image showing the MQW active layer (a part thereof), the AlGaN electron blocking layer, the p-GaN layer (a part thereof) and the vicinity thereof.

In the image case of the present embodiment in which the diffusion prevention layer 16B is provided, it is possible to confirm a layer that is appeared in like a shadow on the interface between the AlGaN layer and the p-GaN layer. This is a concave/convex structure with Mg atoms blocked there becoming visible, which coincides with the results obtained by SIMS. This matter supports the phenomenon in which Mg atoms are blocked by the interfaces. On the other hand, in the image case of the comparative example having no diffusion prevention layer, Mg shadow blocked by the interface such as in the present embodiment is not observed. Although it seems to be satisfactorily observable, the depthwise Mg profile in the layer is not uniform because Mg diffusion occurs easily as shown in FIG. 3.

[Characteristics of LED Elements]

As described above, the Mg in the p-GaN layer can be kept at a high concentration and can be kept constant in the depth direction. Specifically, the amount of holes in the p-GaN layer can be increased, and the area of the two-dimensional hole gas-like layer in the interface between the AlGaN layer and the p-GaN layer can be made smaller. Therefore, the amount of holes injected in the active layer is increased, and light-emitting efficiency is improved. Because the efficiency of hole injection into the active layer improves, the deterioration of light-emitting intensity (droop) during high-current driving can be decreased.

Figure 6:
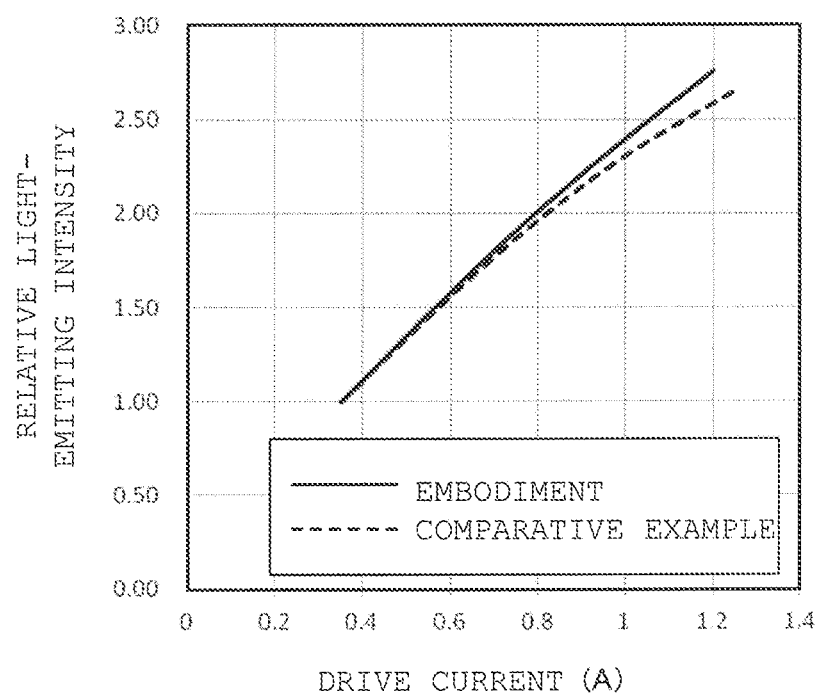
FIG. 6 is a graph showing a comparison of the relationships between the drive electric current value and the light-emitting intensity of an LED element in the embodiment and the comparative example.

FIG. 6 is a graph showing a comparison of the relationships between drive current value and light-emitting intensity of the LED element in the embodiment and the comparative example. The solid line represents the characteristics of the present embodiment having a diffusion prevention layer, and the dashed line represents the characteristics of the comparative example having no diffusion prevention layer. For the sake of comparison, the characteristics are shown as relative light-emitting intensity (vertical axis).

As shown in FIG. 6, when the electric current value is about 0.4 A (amperes), the light-emitting intensity is approximately the same regardless of whether or not there is a diffusion prevention layer. However, in the sample having no diffusion prevention layer, the relative light-emitting intensity begins to deviate from the proportional relationship when the electric current value increases. For example, when the electric current value is approximately 0.8 A and above, the increase in the light-emitting intensity begins to slow, and at 1.2 A, the light-emitting intensity is high, the rate of increase is slowing, and the droop phenomenon is evident. On the other hand, in the sample in which the diffusion prevention layer is introduced, there is little droop in the light-emitting intensity, and even at an electric current value of 1.2 A, the proportional relationship relative to the drive current is maintained and the light-emitting intensity increases. In this experimental data, the electric current value is shown to be in a range between about 0.35 A to 1.2 A. At greater electric currents, the element in which a diffusion prevention layer is introduced had superior droop suppressing characteristics in comparison with the element in which no diffusion prevention layer is introduced. In other words, the present invention makes it possible to provide an LED element in which droop is suppressed by including the diffusion prevention layer, i.e. the light-emitting intensity is high even during high-current driving. Therefore, it is possible to provide a highly reliable semiconductor light-emitting element that has little deterioration.

[Diffusion Prevention Layer]

1. Substance of Diffusion Prevention Layer

As described above, the diffusion prevention layer 16B is an AlGaN layer having tiny concavities and convexities in the surface. The depth of the concavities and convexities is 5 nm or less, and the concave/convex portions fulfill the role of the diffusion prevention layer. Therefore, the thickness of the diffusion prevention layer is 5 nm or less. It is clear that the diffusion prevention layer is a layer having an Al concentration slightly higher (approximately 1 to 3%) than that of the AlGaN layer 16A underneath. Specifically, when the composition of the $Al_xGa_{1-x}N$ layer 16 is 21% (x=0.21), for example, the composition of the diffusion prevention layer (the concave/convex structure layer) is 22 to 24% (x=0.22 to 0.24).

The Al composition of the AlGaN layer 16A is about 10 to 25%, and the thickness of this layer is about 5 to 25 nm (nanometers)). The state of the concavities and convexities changes depending on the growth conditions, and can be controlled to a certain extent. Specifically, when there are few concavities and convexities or when they are shallow, there is less of an Mg blocking effect (interdiffusion-suppressing effect). When there are many concavities and convexities or when they are deep, the blocking effect is high, but there are adverse effects, such as compromised morphology of the p-GaN layer grown thereon. In light of this, the depth of the concave/convex structure layer is preferably 1 to 5 nm, and more preferably 2 to 3 nm.

2. Action of Diffusion Prevention Layer

The dopant blocking effect by the diffusion prevention layer originates in the concave/convex structure of the surface of the AlGaN-EBL layer 16 (i.e. the interface between the AlGaN layer and the p-GaN layer). This means, in other words, that the concave/convex structure contains tiny crystal planes (facets) having plane orientations other than the grown plane orientation. When there are crystal planes having different grown plane orientations, the alignment of atoms is different, and the amount of the dopant element taken into the surfaces therefore changes. Phenomena such as the growth speed or doped amount changing in different grown plane orientations are often observed in crystal growth. As described above, crystals grow on the C-plane (the (0001) plane of a hexagonal system) in the present embodiment, but this embodiment has the characteristic of nitride crystals growing readily in the C-plane direction. Specifically, due to the presence of planes other than the C-plane in the concave/convex structure, diffusion of the dopant (Mg) thereon is suppressed and blocked.

3. Method for Forming a Diffusion Prevention Layer 3.1 Controlling the Supply Ratio of V Group to III Group Raw Materials (V/III Ratio)

When GaN is grown with MOCVD, it is common for the ratio to be about 10000. Normally, a low V/III ratio is used in AlN growth, and the ratio is specifically about 5 to 100. If the AlGaN has an Al composition (x) of 5 to 20%, normally a ratio of about 7,500 to 9,500 is used, but the present invention uses a condition not normally used, where the ratio is 20,000 to 150,000. In light of the depth and size of the concave/convex structure, the ratio is preferably 50,000 to 150,000, and more preferably 50,000 to 80,000. Thus, a concave/convex structure having a strong blocking effect can be created in the surface by greatly increasing the V/III ratio.

3.2 Crystal Growth Temperature

AlGaN is a mixed crystal of GaN and AlN, but GaN and AlN have different optimal growth temperatures. The common growth temperatures are about 1000° C. for GaN and 2000° C. or more for AlN. AlGaN, the mixed crystal of the two, has a different optimal growth temperature depending on the composition. When the temperature is low, concavities and convexities are formed easily, and when the temperature is high, the surface flattens easily. If the AlGaN crystal as an Al composition of 10 to 25%, the objective growth temperature is about 1100 to 1250° C., but in the above embodiment, the crystal is grown at a comparatively low temperature of 1000° C. The growth temperature range is preferably 900° C. to 1250° C.

3.3 Ratio of Hydrogen in Carrier Gas

The ratio F of hydrogen in the carrier gas is expressed in the following formula. In this formula, IG is an inert gas, and specifically, a rare gas such as $N_2$, Ar, or He is used.

$$F=H_2/(H_2+IG)$$

The concavities and convexities are easily formed when F is small, but when F approaches zero (all of the gas becomes an inert gas), the concavities and convexities become sever and problems occur with the crystallinity. Specifically, the growth preferably takes place in a reducing atmosphere. The surface begins to flatten when F is high. In the above embodiment, F=0.23.

As described above, a concave/convex structure having a dopant (Mg) blocking effect is formed in the present invention. The conditions described above such as the V/III ratio, the growth temperature, and the ratio of hydrogen in the carrier gas can be established as the growth conditions in which a concave/convex structure having a high blocking effect, i.e., tiny crystal planes (facets) having different plane orientations from the growth plane, are formed in the surface. Specifically, an optimal concave/convex structure layer can be created by combining the conditions mentioned above.

As described in detail above, according to the present invention, the efficiency of carrier (hole) injection into the active layer is improved by suppressing dopant interdiffusion. Therefore, it is possible to provide a high-performance semiconductor light-emitting element and a method for manufacturing the same in which light-emitting efficiency is high and the deterioration of light-emitting intensity (droop) is decreased even during high-current driving. It is also possible to provide a highly reliable semiconductor light-emitting element that has little deterioration.

It is understood that the foregoing description and accompanying drawings set forth the preferred embodiments of the present invention at the present time. Various modifications, additions and alternative designs will, of course, become apparent to those skilled in the art in light of the foregoing teachings without departing from the spirit and scope of the disclosed invention. Thus, it should be appreciated that the present invention is not limited to the disclosed embodiments but may be practiced within the full scope of the appended claims.

This application is based upon and claims the benefit of priority from the prior Japanese Patent Application No. 2012-253412, filed Nov. 19, 2012, the entire contents of which are incorporated herein by reference.

What is claimed is:

1. A light-emitting element comprising a GaN-based semiconductor, the light-emitting element comprising:

an n-type semiconductor layer;

an active layer formed on said n-type semiconductor layer;

a first semiconductor layer which is doped with Mg, which is formed on said active layer and which has a concave/convex structure layer having a depth of 1 to 5 nm; and a second semiconductor layer doped with Mg and formed on said concave/convex structure layer, wherein said first semiconductor layer comprises an $Al_xGa_{1-x}N$-based semiconductor (0<x), wherein an Al composition of said concave/convex structure layer of said first semiconductor layer is greater than an Al composition of other portions of said first semiconductor layer.

2. The light-emitting element according to claim 1, wherein the active layer is a quantum well active layer having at least one pair of a well layer and a barrier layer, and wherein said first semiconductor layer has a band gap greater than a band gap of said barrier layer of the quantum well active layer.

3. The light-emitting element according to claim 1, wherein an Mg concentration in said first semiconductor layer is greater than an Mg concentration in said second semiconductor layer.

* * * * *